US010677579B2

(12) United States Patent
Kuhnen et al.

(10) Patent No.: US 10,677,579 B2
(45) Date of Patent: *Jun. 9, 2020

(54) CAPACITIVE DISTANCE SENSOR

(71) Applicant: Brose Fahrzeugteile GmbH & Co. Kommanditgesellschaft, Bamberg, Bamberg (DE)

(72) Inventors: Thorsten Kuhnen, Litzendorf (DE); Holger Wuerstlein, Zeil am Main (DE)

(73) Assignee: Brose Fahrzeugteile GmbH & Co. Kommanditgesellschaft, Bamberg, Bamberg (DE)

( * ) Notice: Subject to any disclaimer, the term of this patent is extended or adjusted under 35 U.S.C. 154(b) by 222 days.

This patent is subject to a terminal disclaimer.

(21) Appl. No.: 15/584,269

(22) Filed: May 2, 2017

(65) Prior Publication Data

US 2017/0234671 A1  Aug. 17, 2017

Related U.S. Application Data

(63) Continuation of application No. 13/793,219, filed on Mar. 11, 2013, now Pat. No. 9,702,682, which is a (Continued)

(30) Foreign Application Priority Data

Sep. 10, 2010  (DE) .................. 10 2010 045 008

(51) Int. Cl.
*G01B 7/04* (2006.01)
*H03K 17/955* (2006.01)
(Continued)

(52) U.S. Cl.
CPC ............. *G01B 7/044* (2013.01); *G01B 7/023* (2013.01); *G01B 7/08* (2013.01); *H03K 17/955* (2013.01);
(Continued)

(58) Field of Classification Search
CPC ..... G01L 37/023; G01L 7/044; H03K 17/955; G01B 7/08; G01B 7/023; G01B 7/044
See application file for complete search history.

(56) References Cited

U.S. PATENT DOCUMENTS 5,166,679 A   11/1992  Vranish et al.
5,326,133 A    7/1994  Breed et al.
(Continued)

FOREIGN PATENT DOCUMENTS

CN   1107970 A   9/1995
CN   2538857 Y   3/2003
(Continued)

OTHER PUBLICATIONS

Chinese Office Action for Chinese Application No. 201180043643.9 dated Feb. 2, 2015 with English translation.

*Primary Examiner* — Douglas X Rodriguez
*Assistant Examiner* — Brent J Andrews
(74) *Attorney, Agent, or Firm* — Muncy, Geissler, Olds & Lowe, P.C.

(57) ABSTRACT

A capacitive distance sensor includes a sensor element having an electrically conductive, elongated, flat sensor area which in turn contains a number of holes. The sensor area is completely surrounded by an electrically non-conductive insulating body, with the result that the insulating body completely covers the edge regions of the holes. The sensor element is produced, in particular, by first of all making the holes in the sensor area. In a subsequent step, the sensor area is completely encased by the insulating body which also completely fills the holes in the sensor area.

19 Claims, 2 Drawing Sheets

Related U.S. Application Data continuation of application No. PCT/EP2011/004454, filed on Sep. 5, 2011.

(51) Int. Cl.
    *G01B 7/02*     (2006.01)
    *G01B 7/06*     (2006.01)
    *B60R 19/48*    (2006.01)

(52) U.S. Cl.
    CPC .............. *B60R 19/483* (2013.01); *G01B 7/02* (2013.01); *Y10T 29/49117* (2015.01)

(56) References Cited

U.S. PATENT DOCUMENTS

| | | |
|---|---|---|
| 5,394,292 A | 2/1995 | Hayashida |
| 5,507,080 A | 4/1996 | Hayashi et al. |
| 6,750,624 B2 | 6/2004 | Haag et al. |
| 6,879,250 B2 | 4/2005 | Fayt et al. |
| 2002/0021133 A1 | 2/2002 | Okamoto et al. |
| 2003/0071640 A1 | 4/2003 | Haag et al. |
| 2003/0094959 A1 | 5/2003 | Hoisington et al. |
| 2003/0097107 A1* | 5/2003 | Sprengard-Eichel ....................... A61F 13/15203 604/378 |
| 2003/0222660 A1* | 12/2003 | Morimoto ............... G01L 1/142 324/661 |
| 2004/0175257 A1 | 9/2004 | Pallas |
| 2004/0178678 A1* | 9/2004 | Schroer ................ H03K 17/955 307/10.1 |
| 2005/0099035 A1* | 5/2005 | Fries .................... B62D 25/161 296/198 |
| 2008/0211489 A1* | 9/2008 | Reusing ................. F16C 29/00 324/207.16 |
| 2009/0001999 A1* | 1/2009 | Douglas ............... H03K 17/955 324/688 |
| 2009/0051356 A1* | 2/2009 | Nishide ................. G01B 7/023 324/207.26 |
| 2009/0146668 A1* | 6/2009 | Wuerstlein ........... B60N 2/0244 324/663 |
| 2009/0295410 A1 | 12/2009 | Sakamaki |

FOREIGN PATENT DOCUMENTS

| | | |
|---|---|---|
| CN | 101375501 A | 2/2009 |
| CN | 101821133 A | 9/2010 |
| DE | 602 05 520 T2 | 3/2006 |
| DE | 603 15 743 T2 | 6/2008 |
| GB | 2 255 641 A | 11/1992 |
| WO | WO 2009/048910 A2 | 4/2009 |

* cited by examiner

CAPACITIVE DISTANCE SENSOR

This nonprovisional application is a continuation of U.S. application Ser. No. 13/793,219, filed on Mar. 11, 2013, which is a continuation of International Application No. PCT/EP2011/004454, which was filed on Sep. 5, 2011, and which claims priority to German Patent Application No. DE 10 2010 045 008.1, which was filed in Germany on Sep. 10, 2010, and which are both herein incorporated by reference.

BACKGROUND OF THE INVENTION

Field of the Invention

The present invention relates to a capacitive distance sensor having an elongated sensor element, in particular for use in the automobile industry. Furthermore, the invention relates to a method for manufacturing such a sensor element.

Description of the Background Art

In the automobile industry such sensors are used, in particular, for detecting an object approaching a vehicle or vehicle component, for example as part of a parking aid or as part of an anti-trapping device for electrically adjustable windows or doors. A further field of application of such capacitive distance sensors is aerospace or use in industrial systems.

U.S. Pat. No. 5,166,679 A discloses a capacitive distance sensor having a sensor element which comprises a sensor surface and which is mounted on an element to be protected. The sensor surface is substantially a planar, extensive, thin and electrically conductive surface and forms an electrode of a capacitor. An object which penetrates the area to be monitored by the sensor serves as an opposing electrode of the capacitor. When the object approaches the sensor element, the capacitance of the capacitor formed between the sensor surface and the opposing electrode changes. The change in capacitance is measured directly and/or indirectly by means of electronics. The distance between the object and the sensor element is determined by means of the measurement data.

DE 602 05 520 T2, which corresponds to U.S. Pat. No. 6,879,250, and which discloses a further capacitive distance sensor having an elongated sensor element. The sensor element is bonded here onto a bodywork part of a motor vehicle.

SUMMARY OF THE INVENTION

It is therefore an object of the present invention to provide a capacitive distance sensor having an elongated sensor element which can be easily and securely attached to an object and which is not susceptible to corrosion or soiling. Furthermore, the invention is based on the object of specifying a particularly suitable method for manufacturing such a sensor element.

According to an embodiment of the invention, the capacitive distance sensor comprises an elongated sensor element which contains an electrically conductive, elongated, flat sensor surface. A number of holes are formed in the, in particular strip-shaped, sensor surface. For example, the holes serve to accommodate an attachment component such as a screw or a clip by means of which the sensor element can be attached to an object, such as the bodywork of a motor vehicle. Such attachment permits comparatively rapid mounting of the sensor element. In order to protect the sensor surface against mechanical or chemical damage, such as for example influences of the weather, when the sensor element is mounted in the external region of the motor vehicle according to the invention the sensor surface is surrounded completely by an insulating body. In this context, the edge regions of the holes are also enclosed by the insulating body so that no region of the sensor surface is in contact with the environment.

The geometry of all the holes of the sensor surface can be the same. The center points of the holes are expediently located on a straight line which extends in the longitudinal direction of the sensor element. In particular, the holes of the sensor surface are embodied as elongated holes, wherein the comparatively long axes of the elongated holes extend along the longitudinal direction of the sensor surface. Owing to these elongated holes, the sensor element permits high tolerances during the arrangement of the attachment component on the motor vehicle without the holes having to be reworked to accommodate the attachment component during the mounting process.

In an embodiment of the invention, the sensor element is flexible. The sensor surface can be composed of copper and is expediently formed from a ribbon cable line. The insulating body is composed, for example, essentially of PVC. The insulating body is preferably cuboid and has, in particular, a length between 10 cm and 200 cm, a width between 0.1 cm and 10 cm and a thickness between 0.1 mm and 20 mm.

In an unmounted state, the insulating body can completely fill the holes of the sensor surface. For example, in this case during the mounting process the screws which serve for attachment are screwed directly into the insulating body. However, in one preferred embodiment a number of cutouts are already provided in the insulating body, in particular for easy mounting of the sensor element on an object. A cutout is generally understood here to be a through-opening inside the insulating body. The insulating body preferably has precisely as many cutouts as the sensor surface has holes. In each case precisely one of the cutouts is therefore arranged inside one of the holes, wherein the edge of the cutout is not in contact with the edge of the respective hole, with the result that the sensor element is sealed off hermetically. The distance between the edge of the cutout and the edge of the associated hole is advantageously essentially constant, with the result that the cross-sectional area of the cutout has the shape of the associated hole, wherein the surface content of the cross-sectional area is smaller than the size of the hole. The shape of all the cutouts is expediently the same.

A termination which is connected to the insulating layer in a sealed fashion is located at at least one longitudinal end of the sensor element. The termination is preferably composed of a melting adhesive based on polyamide, in particular made of macromelt, and it is injection molded or cast onto the sensor element. The termination can alternatively be plugged onto the end of the sensor element and fused or bonded to the insulating layer in a seal-forming fashion. A contact point, at which the sensor surface is in contact with an electrical connecting line, is preferably embedded in at least one of the terminations.

According to the inventive manufacturing method, the holes can firstly made in the sensor surface. This can be done, for example, by punching.

In a subsequent working step, the sensor surface can be completely enclosed by the insulating body, wherein the holes of the sensor surface are firstly filled by the insulating body. The insulating body can be provided, for example, by encapsulating the sensor surface by injection molding. It would also be conceivable to laminate the sensor surface in between two plastic strips which are bonded or fused to one another in order to form the insulating body and have a greater extent than the sensor surface and protrude completely beyond the edges of the sensor surface.

In an embodiment of the method, in a further working step precisely one cutout is made, preferably punched, in the insulating body in each case in the region of each of the holes in such a way that the edge of each cutout is not in contact with the edge of the associated hole, and the sensor element is thus hermetically terminated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Corresponding parts are provided with the same reference symbols in all the figures.

Figure 1:
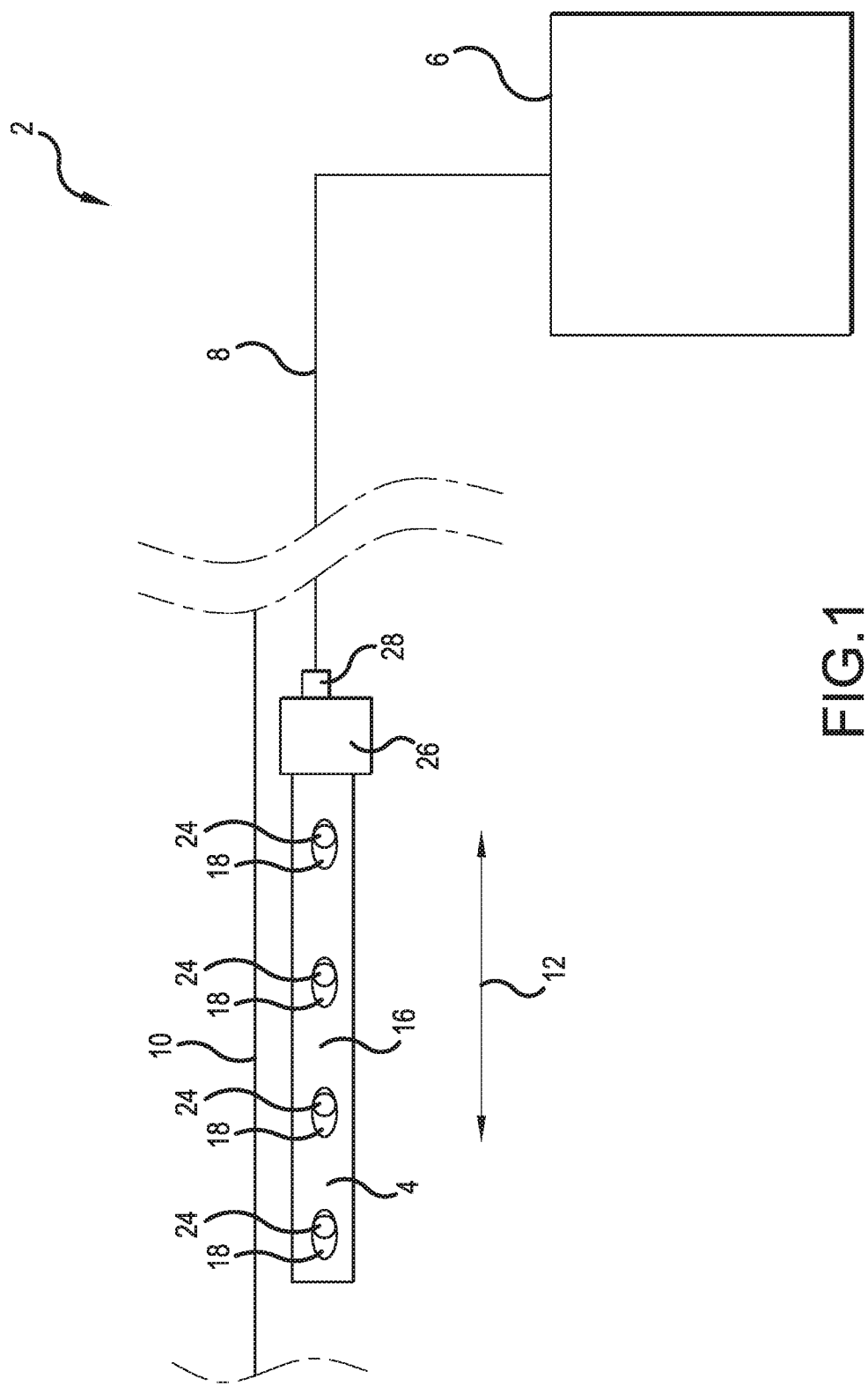
FIG. 1 is a schematic view of a capacitive distance sensor with an elongated sensor element.

FIG. 1 is a schematic view of a capacitive distance sensor 2. The distance sensor 2 comprises an elongated, flexible sensor element 4, electronics 6 and a connecting line 8 which connects the sensor element 4 electrically to the electronics 6. For example, the distance sensor 2 is located inside a motor vehicle. In particular, within the scope of a keyless automatic starting system (Keyless-Go) the approaching of the parked motor vehicle by a person is monitored by means of the distance sensor 2. In one expedient application case, the sensor element 4 is mounted in the rear region of the motor vehicle, for example on the rear bumper 10. The longitudinal direction 12 of the sensor element 4 suitably runs parallel to the wheel axes of the vehicle.

The electronics 6 supply the sensor element 4 with current and evaluate the measurement data of the sensor element 4. In particular, on the basis of a signal emitted by the distance sensor 2, the rear tailgate of the motor vehicle can be opened, with the result that the approaching person does not have to perform any manual activity to open the tailgate.

Figure 2:
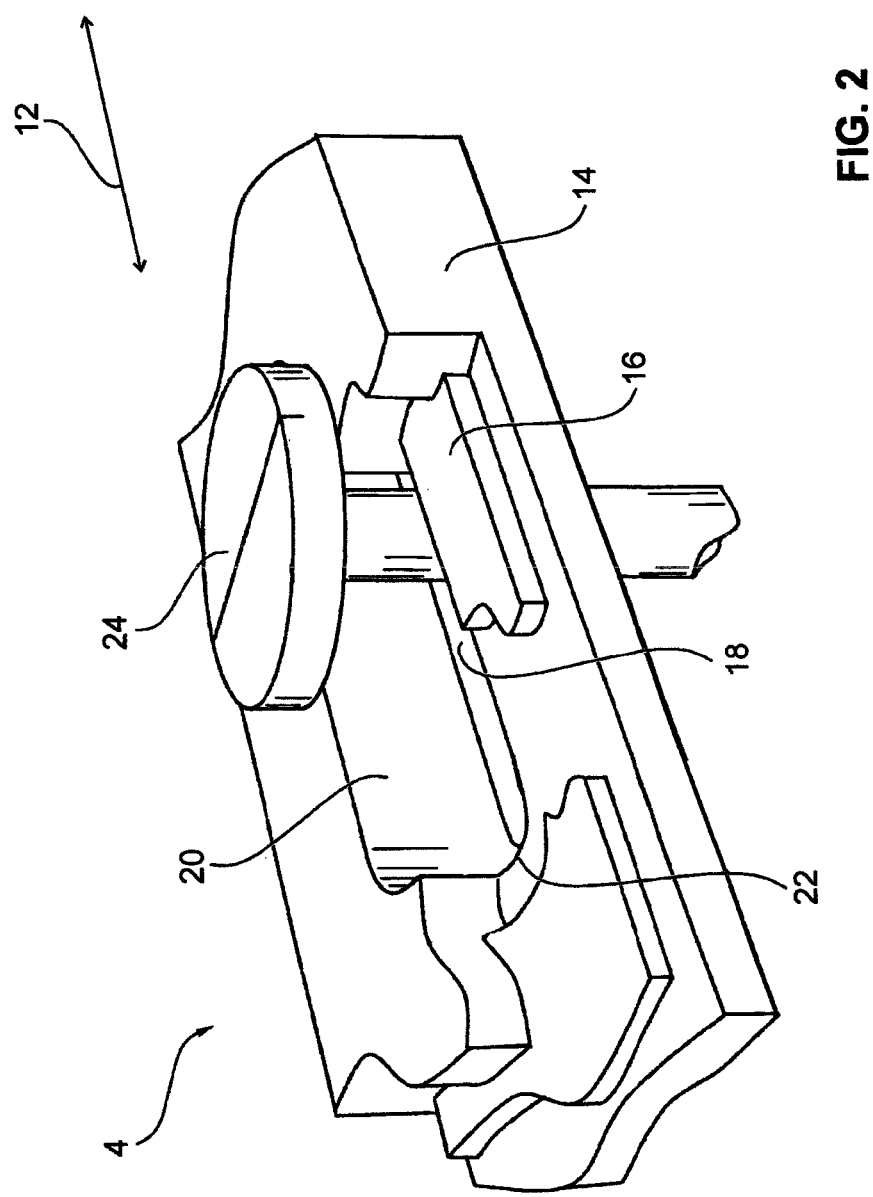
FIG. 2 shows a detail of the sensor element in a perspective view.

FIG. 2 illustrates the sensor element 4 in more detail. As is apparent from the illustration, the sensor element 4 comprises an insulating body 14 into which a sensor surface 16 is embedded in such a way that the sensor surface 16 is completely enclosed by the insulating body 14. The insulating body 14 bears in a positively locking fashion against the sensor surface 16, for example in order to avoid displacement of the sensor surface 16 with respect to the insulating body 14 and/or in order to increase the stability of the sensor element 4. The sensor surface 16 which is composed, for example, of copper is elongated and flat and is, in particular, in the shape of a strip. A number of holes 18 are punched into the sensor surface 16. The holes 18 are in the shape of an elongated hole, wherein the long axes of the elongated holes extend along the longitudinal direction 12 of the sensor surface 16. The center points of the holes 18 are located on a straight line which extends in the longitudinal direction 12 of the sensor surface 16 and is located centrally on the sensor surface 16.

The insulating body 14 which is composed, in particular, of PVC is in the shape of a flat cuboid, wherein two surfaces are parallel to the sensor surface 16. The insulating body 14 has, for example, a length of approximately 63 cm, a width of approximately 3 cm and a thickness of approximately 0.2 cm. A cutout 20 of the insulating body 14 runs within each hole 18 of the sensor surface 16. The shape of the cutouts 20 corresponds essentially to that of the holes 18. The edge region 22 of the holes 18 is filled by the insulating body 14. In the mounted state of the distance sensor 2, for example in each case a screw 24 can be located within the cutouts 20, which screw 24 is used to attach the sensor element 4 to an object.

A termination 26 (FIG. 1) is located at one end of the sensor element 4. The body of the termination 26 is composed of macromelt and is cast onto the sensor element 4. A connecting point 28, at which the sensor element 4 is electrically in contact with the connecting line 8, is embedded in the termination 26.

The holes 18 are firstly punched into the sensor surface 16 within the course of the manufacture of the sensor element 4. In a subsequent working step, the sensor surface 16 is encased completely by the insulating body 14. The cutouts 20 are subsequently formed in the insulating body 14.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A capacitive distance sensor, comprising:
    a sensor element, the sensor element comprising:
        an electrically conductive, elongated, flat sensor;
        a plurality of holes formed in the flat sensor, the holes extending from an upper surface of the flat sensor to a lower surface of the flat sensor; and
        an electrically nonconductive insulating body completely enclosing at least the upper surface and the lower surface of the flat sensor and the insulating body extending into the holes from the upper surface and the lower surface so as to form a uniform body completely covering inner surfaces of the holes.

2. The capacitive distance sensor as claimed in claim 1, wherein the holes are configured as elongated holes and wherein comparatively long axes of the elongated holes extend in a longitudinal direction of the flat sensor.

3. The capacitive distance sensor as claimed in claim 1, wherein the sensor element is flexible.

4. The capacitive distance sensor as claimed in claim 1, wherein the flat sensor is composed of copper.

5. The capacitive distance sensor as claimed in claim 1, wherein at least a portion of the insulating body is composed of PVC.

6. The capacitive distance sensor as claimed in claim 1, wherein the insulating body contains a plurality of cutouts corresponding to the plurality of holes, and wherein each cutout extends within one of the holes.

7. The capacitive distance sensor as claimed in claim 6, wherein a cross-sectional area of each cutout has substantially a same shape as that of the respective corresponding hole through which the cutout extends.

8. A method for manufacturing a sensor element for a capacitive distance sensor as claimed in claim 1, the method comprising:
   forming a plurality of holes in the flat sensor, composed of the electrically conductive material, the holes extending from an upper surface of the flat sensor to a lower surface of the flat sensor;
   completely enclosing, in a subsequent working step, at least the upper surface and the lower surface of the flat sensor by an insulating body which is composed of an electrically nonconductive material and which also extends from the upper surface and the lower surface of the flat sensor into the holes to completely fill the holes of the flat sensor.

9. The method for manufacturing a sensor element as claimed in claim 8, wherein, in a subsequent working step, a plurality of cutouts corresponding to the plurality of holes is made in the insulating body such that each cutout runs within one of the holes, and wherein an edge of the cutout is consistently at a distance from an edge of an associated hole.

10. The capacitive distance sensor as claimed in claim 1, wherein the insulating body directly contacts all surfaces of the flat sensor.

11. The capacitive distance sensor as claimed in claim 1, wherein the insulating body bears against all surfaces of the flat sensor.

12. The capacitive distance sensor as claimed in claim 1, further comprising a macromelt termination cast on an end of the sensor element.

13. The capacitive distance sensor as claimed in claim 1, further comprising a plurality of fasteners disposed in the plurality of holes, a first end of each of the fasteners extending upward beyond an upper surface of the insulating body and a second end of each of the fasteners extending downward beyond a lower surface of the insulating body.

14. The capacitive distance sensor as claimed in claim 1, wherein each of two opposing sides of the insulating body have cutouts, the cutouts of each of the two opposing sides being aligned with the holes of the flat sensor to form a plurality of through-holes that extend through the capacitive distance sensor.

15. A sensor element, comprising:
   an electrically conductive, elongated, flat sensor;
   a plurality of holes formed in the flat sensor, the holes extending from an upper surface of the flat sensor to a lower surface of the flat sensor; and
   an electrically nonconductive insulating body completely enclosing at least the upper surface and the lower surface of the flat sensor and the insulting body extending into the holes from the upper surface and the lower surface so as to form a uniform body completely covering inner surfaces of the holes.

16. The sensor element as claimed in claim 15, further comprising a plurality of fasteners disposed in the plurality of holes, a first end of each of the fasteners extending upward beyond an upper surface of the insulating body and a second end of each of the fasteners extending downward beyond a lower surface of the insulating body.

17. A capacitive distance sensor, comprising:
   a sensor element, the sensor element comprising:
      an electrically conductive, elongated, flat sensor;
      a plurality of holes formed in the flat sensor, the holes extending from an upper surface of the flat sensor to a lower surface of the flat sensor; and
      an electrically nonconductive insulating body completely enclosing at least the upper surface and the lower surface of the flat sensor and the insulting body extending into the holes from the upper surface and the lower surface so as to form a uniform body completely covering inner surfaces of the holes,
   wherein the capacitive distance sensor is a flat elongate element.

18. The capacitive distance sensor according to claim 17, wherein an entirety of the capacitive distance sensor is flat and elongate.

19. The capacitive distance sensor as claimed in claim 17, further comprising a plurality of fasteners disposed in the plurality of holes, a first end of each of the fasteners extending upward beyond an upper surface of the insulating body and a second end of each of the fasteners extending downward beyond a lower surface of the insulating body.

* * * * *